United States Patent
Kawakami et al.

(10) Patent No.: US 11,036,140 B2
(45) Date of Patent: Jun. 15, 2021

(54) SUBSTRATE PROCESSING APPARATUS, SUBSTRATE PROCESSING METHOD AND RECORDING MEDIUM

(71) Applicant: Tokyo Electron Limited, Tokyo (JP)

(72) Inventors: Shinichiro Kawakami, Koshi (JP); Hiroshi Mizunoura, Koshi (JP); Yohei Sano, Koshi (JP); Takashi Yamauchi, Koshi (JP); Masashi Enomoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/747,882

(22) Filed: Jan. 21, 2020

(65) Prior Publication Data

US 2020/0233308 A1 Jul. 23, 2020

(30) Foreign Application Priority Data

Jan. 22, 2019 (JP) .............................. JP2019-008674

(51) Int. Cl.
*G03B 27/32* (2006.01)
*G03F 7/16* (2006.01)

(52) U.S. Cl.
CPC .................................. *G03F 7/168* (2013.01)

(58) Field of Classification Search
CPC . C23C 16/00; G03F 7/168; G03F 7/38; H01L 21/00; H01L 21/67178
See application file for complete search history.

(56) References Cited

U.S. PATENT DOCUMENTS

2018/0164689 A1* 6/2018 Sano ................. H01L 21/31058

FOREIGN PATENT DOCUMENTS

JP 2008-130857 A 6/2008

* cited by examiner

*Primary Examiner* — Peter B Kim
(74) *Attorney, Agent, or Firm* — Pearne & Gordon LLP

(57) ABSTRACT

A substrate processing apparatus includes a film forming processing unit configured to form a metal-containing resist film on a substrate; a heat treatment unit configured to perform a heating processing on the substrate on which the film is formed and in which an exposure processing is performed on the film; a developing processing unit configured to perform a developing processing on the film formed on the substrate on which the heating processing is performed; and an adjustment controller configured to reduce a difference between substrates in an amount of water that reacts in the film formed on the substrate during the heating processing.

17 Claims, 9 Drawing Sheets

SUBSTRATE PROCESSING APPARATUS, SUBSTRATE PROCESSING METHOD AND RECORDING MEDIUM

CROSS-REFERENCE TO RELATED APPLICATION

This application claims the benefit of Japanese Patent Application No. 2019-008674 filed on Jan. 22, 2019, the entire disclosures of which are incorporated herein by reference.

TECHNICAL FIELD

The exemplary embodiments described herein pertain generally to a substrate processing apparatus, a substrate processing method and a recording medium.

BACKGROUND

Patent Document 1 discloses a substrate processing apparatus that forms a resist pattern using a chemical-amplification type resist. In this substrate processing apparatus, a controller sets a substrate on standby in a standby section to make a time period constant among substrates from the end of exposure in an exposure apparatus to the start of a post-exposure baking processing in a post-exposure baking unit.

Patent Document 1: Japanese Patent Laid-open Publication No. 2008-130857

SUMMARY

In one exemplary embodiment, a substrate processing apparatus includes a film forming processing unit configured to form a metal-containing resist film on a substrate; a heat treatment unit configured to perform a heating processing on the substrate on which the film is formed and in which an exposure processing is performed on the film; a developing processing unit configured to perform a developing processing on the film formed on the substrate on which the heating processing is performed; and an adjustment controller configured to reduce a difference between substrates in an amount of water that reacts in the film formed on the substrate during the heating processing.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

In the detailed description that follows, exemplary embodiments are described as illustrations only since various changes and modifications will become apparent to those skilled in the art from the following detailed description. The use of the same reference numbers in different figures indicates similar or identical items.

DETAILED DESCRIPTION

Figure 1:
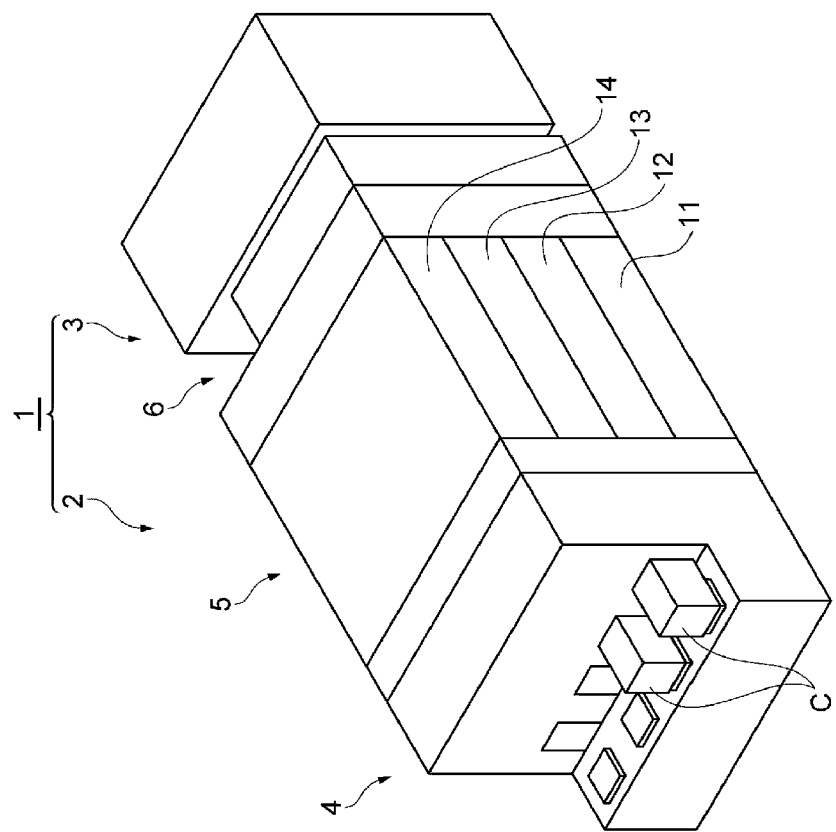
FIG. 1 is an exemplary diagram illustrating a schematic configuration of a substrate processing system according to a first exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other exemplary embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described. In the following description, same parts or parts having same function will be assigned same reference numerals, and redundant description will be omitted.

First Exemplary Embodiment

First, a substrate processing system according to a first exemplary embodiment will be described with reference to FIG. 1 to FIG. 7.

[Substrate Processing System]

A substrate processing system 1 is configured to perform formation of a photosensitive film on a substrate, exposure of the photosensitive film to light and development of the photosensitive film. The substrate serving as a processing target is, e.g., a semiconductor wafer W. The photosensitive film is, e.g., a resist film. The substrate processing system 1 includes a coating/developing apparatus 2 and an exposure apparatus 3. The exposure apparatus 3 is an apparatus for exposure processing configured to expose the resist film (photosensitive film) formed on the wafer W (substrate). An interior space of the exposure apparatus 3 is maintained, e.g., in a substantially vacuum state. Specifically, the exposure apparatus 3 is configured to irradiate energy rays to an exposure target portion of the resist film by a method such as a liquid immersion lithography or the like. The coating/developing apparatus 2 performs a processing of forming the resist film by coating a resist (chemical liquid) on the surface of the wafer W (substrate) before the exposure processing by the exposure apparatus 3, and performs a developing processing on the resist film after the exposure processing. In the substrate processing system 1, by using a resist containing metal (hereinafter, referred to as "metal-containing resist"), a metal-containing resist film is formed. For example, the substrate processing system 1 may form the film with a resist containing metal oxide.

[Substrate Processing Apparatus]

Figure 2:
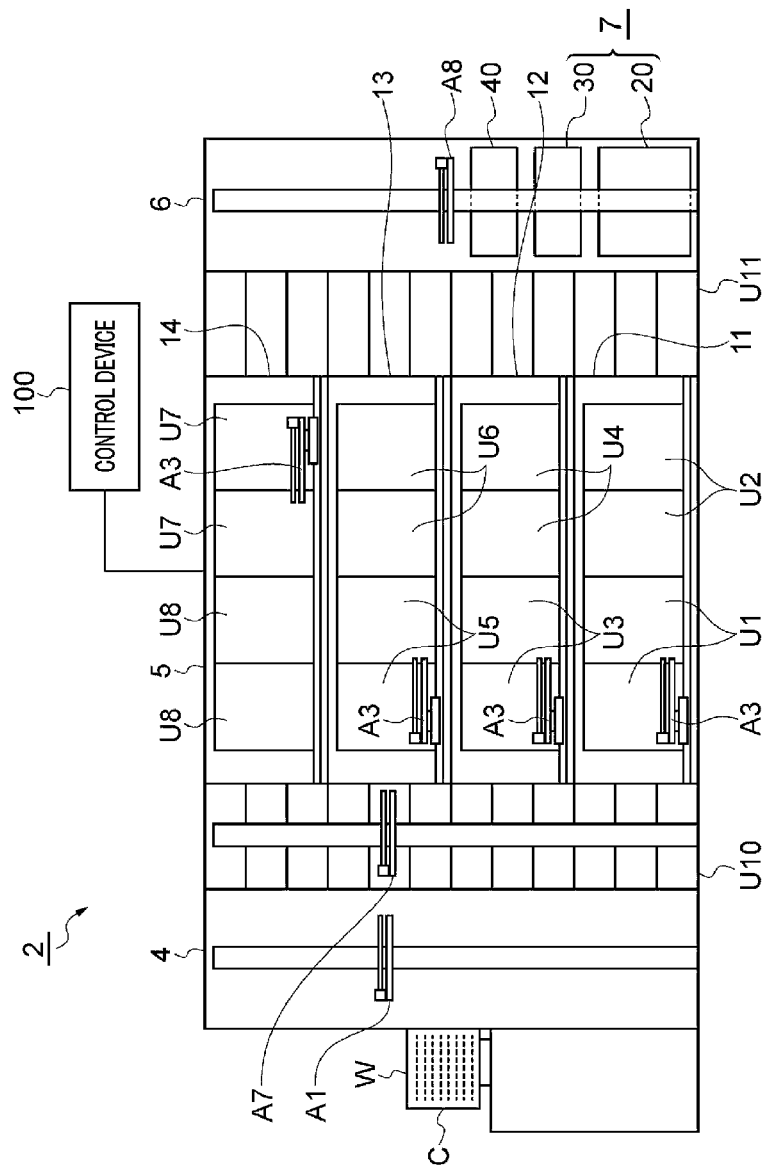
FIG. 2 is a schematic view illustrating an internal configuration of a substrate processing apparatus according to the first exemplary embodiment.

First, the configuration of the coating/developing apparatus 2 which is an example of a substrate processing apparatus will be described. As illustrated in FIG. 1 and FIG. 2, the coating/developing apparatus 2 includes a carrier block 4, a processing block 5, an interface block 6, a humidity adjusting mechanism 7 and a control device 100 (adjustment controller).

The carrier block 4 carries the wafer W into the coating/developing apparatus 2 and carries the wafer W out of the coating/developing apparatus 2. For example, the carrier block 4 can support a plurality of carriers C for wafers W and includes a transfer device A1 including a transfer arm. Each of the carriers C receives, e.g., a plurality of circular wafers W therein. The transfer device A1 takes a wafer W from the carrier C to deliver the same to the processing block 5, and receives the wafer W from the processing block 5 to return the same to the carrier C. The processing block 5 includes a plurality of processing modules 11, 12, 13 and 14.

The processing module 11 includes a coating unit U1, a heat treatment unit U2 and a transfer device A3 configured to transfer the wafers W to these units. The processing module 11 is configured to form a lower layer film on the surface of the wafer W by the coating unit U1 and the heat treatment unit U2. The coating unit U1 is configured to coat a processing liquid for forming the lower layer film onto the wafer W. The heat treatment unit U2 is configured to perform various heat treatments involved in the formation of the lower layer film.

The processing module 12 (film forming processing unit) includes a coating unit U3, a heat treatment unit U4 and a transfer device A3 configured to transfer the wafers W to these units. The processing module 12 is configured to form the metal-containing resist film on the lower layer film by the coating unit U3 and the heat treatment unit U4. The coating unit U3 is configured to coat the metal-containing resist, which is a processing liquid for forming the film, onto the lower layer film. The heat treatment unit U4 is configured to perform various heat treatments involved in the formation of the film. Accordingly, the metal-containing resist film is formed on the surface of the wafer W.

The processing module 13 includes a coating unit U5, a heat treatment unit U6 and a transfer device A3 configured to transfer the wafers W to these units. The processing module 13 is configured to form an upper layer film on the resist film by the coating unit U5 and the heat treatment unit U6. The coating unit U5 is configured to coat a liquid for forming the upper layer film onto the resist film. The heat treatment unit U6 is configured to perform various heat treatments involved in the formation of the upper layer film.

The processing module 14 includes a developing unit U7 (developing processing unit), a heat treatment unit U8 (heat treatment unit) and a transfer device A3 configured to transfer the wafers W to these units. The processing module 14 is configured to perform a developing processing on the film to which the exposure processing has been performed and a heating processing involved in the developing processing by the developing unit U7 and the heat treatment unit U8. Accordingly, a resist pattern is formed on the surface of the wafer W by using the metal-containing resist film. The developing unit U7 is configured to coat a developing liquid onto the surface of the wafer W to which the exposure processing has been performed and then washes the surface of the wafer W with a rinse liquid to perform the developing processing on the metal-containing resist film. The heat treatment unit U8 is configured to perform various heat treatments involved in the developing processing. Specific examples of the heat treatments may include a heating processing before the developing processing (post exposure bake (PEB)), a heating processing after the developing processing (post bake (PB)) and the like. The developing unit U7 develops the wafer W to which the heat processing (PEB) has been performed by the heat treatment unit U8. In the following description, unless otherwise specified, the heating processing by the heat treatment unit U8 will be described as "post exposure bake (PEB)". Also, the metal-containing resist film will be simply described as "film".

A shelf unit U10 is provided within the processing block 5 to be adjacent to the carrier block 4. The shelf unit U10 is divided into a plurality of cells arranged in a vertical direction. A transfer device A7 including an elevating arm is provide near the shelf unit U10. The transfer device A7 vertically moves the wafer W between the cells of the shelf unit U10.

A shelf unit U11 is provided within the processing block 5 to be adjacent to the interface block 6. The shelf unit U11 is divided into a plurality of cells arranged in the vertical direction.

The interface block 6 delivers the wafer W to and from the exposure apparatus 3. For example, the interface block 6 includes a transfer device A8 including a transfer arm, and is connected to the exposure apparatus 3. The transfer device A8 delivers the wafer W placed in the shelf unit U11 to the exposure apparatus 3 through the humidity adjusting mechanism 7. The transfer device A8 receives the wafer W from the exposure apparatus 3 and returns the same to the shelf unit U11 through the humidity adjusting mechanism 7.

The humidity adjusting mechanism 7 is configured to adjust a water amount contained in the film (water content) formed on the surface of the wafer W. The adjustment of the water content in the film includes at least one of increasing the water content, decreasing the water content or suppressing a variation in the water content. For example, the humidity adjusting mechanism 7 is provided within the interface block 6. The humidity adjusting mechanism 7 includes a substrate accommodating unit 20 and a wafer removing unit 30. The substrate accommodating unit 20 is configured to accommodate a plurality of wafers W and suppress the variation in the water content of the films on the accommodated wafers W. The water removing unit 30 is configured to accommodate one or more wafers W and decrease the water content of the films on the accommodated wafers W. Examples of these units will be described later.

The control device 100 controls the coating/developing apparatus 2 to perform a coating/developing processing, for example, in the following sequence. First, the control device 100 controls the transfer device A1 to transfer the wafer W placed in the carrier C to the shelf unit U10 and controls the transfer device A7 to place the wafer W in a cell corresponding to the processing module 11.

Then, the control device 100 controls the transfer device A3 to transfer the wafer W placed in the shelf unit U10 to the coating unit U1 and the heat treatment unit U2 within the processing module 11. Also, the control device 100 controls the coating unit U1 and the heat treatment unit U2 to form the lower layer film on the surface of the wafer W. Thereafter, the control device 100 controls the transfer device A3 to return the wafer W having the lower layer film formed thereon to the shelf unit U10 and controls the transfer device A7 to place the wafer W in a cell corresponding to the processing module 12.

Subsequently, the control device 100 controls the transfer device A3 to transfer the wafer W placed in the shelf unit U10 to the coating unit U3 and the heat treatment unit U4 within the processing module 12. Also, the control device 100 controls the coating unit U3 and the heat treatment unit U4 to form the metal-containing resist film on the lower layer film of the wafer W. Thereafter, the control device 100 controls the transfer device A3 to return the wafer W to the shelf unit U10 and controls the transfer device A7 to place the wafer W in a cell corresponding to the processing module 13.

The control device 100 controls the transfer device A3 to transfer the wafer W placed in the shelf unit U10 to each unit within the processing module 13. Also, the control device 100 controls the coating unit U5 and the heat treatment unit U6 to form the upper layer film on the film of the wafer W. Thereafter, the control device 100 controls the transfer device A3 to transfer the wafer W to the shelf unit U11.

Then, the control device 100 controls the transfer device A8 to carry the wafer W placed in the shelf unit U11 into the substrate accommodating unit 20 and transfer the wafer W accommodated in the substrate accommodating unit 20 to the exposure apparatus 3. Thereafter, the control device 100 controls the transfer device A8 to receive the wafer W to which the exposure processing has been performed from the exposure apparatus 3 and carry the wafer W into the water removing unit 30. Then, the control device 100 controls the transfer device A8 to place the wafer placed in the water removing unit 30 in a cell corresponding to the processing module 14 in the shelf unit U11.

Subsequently, the control device 100 controls the transfer device A3 to transfer the wafer W placed in the shelf unit U11 to the heat treatment unit U8 within the processing module 14. Then, the control device 100 controls the heat treatment unit U8 to perform the heating processing onto the film on the wafer W. Thereafter, the control device 100 controls the developing unit U7 and the heat treatment unit U8 to perform the developing processing and the post exposure bake (PEB) on the film on the wafer W to which the heating processing has been performed by the heat treatment unit U8. Then, the control device 100 controls the transfer device A3 to return the wafer W to the shelf unit U10 and controls the transfer device A7 and the transfer device A1 to return the wafer W into the carrier C. In this manner, the coating/developing processing is completed.

The specific configuration of the substrate processing apparatus is not limited to the configuration of the coating/developing apparatus 2 described above. The substrate processing apparatus is not particularly limited as long as it includes the film forming unit for forming the metal-containing resist film, the heat treatment unit for heating the film after the exposure processing, the developing unit for developing the film and the control device capable of controlling these units. Each unit of the humidity adjusting mechanism 7 may be provided within the carrier block 4 or within the processing modules 11, 12, 13 and 14.

(Humidity Adjusting Mechanism)

Hereinafter, the configuration of each unit of the humidity adjusting mechanism 7 will be described. As described above, the substrate accommodating unit 20 illustrated in FIG. 3A accommodates a plurality of wafers W and suppresses the variation in the water content of the films on the accommodated wafers W. The substrate accommodating unit 20 can accommodate the plurality of wafers W and thus function as a buffer that sets the wafers W on standby until the wafers W are delivered to the exposure apparatus 3. Further, the substrate accommodating unit 20 may be provided between the interface block 6 and the exposure apparatus 3.

The variation in the water content within the substrate accommodating unit 20 is more suppressed than that within a transfer space where the transfer devices of the coating/developing apparatus 2 are accommodated (e.g., space where the transfer devices A3 and A8 can be moved). A range of the water content variation per unit time for the wafer W accommodated within the substrate accommodating unit 20 is smaller than that for the wafer W staying in any one of the transfer space and the exposure apparatus 3. If the water content of the wafer W staying in the transfer space increases, the increase range of the water content per unit time for the wafer W accommodated within the substrate accommodating unit 20 is smaller than that for the wafer W within the transfer space. If the inside of the exposure apparatus 3 is maintained in a substantially vacuum state and the wafer W stays within the exposure apparatus 3, the water content of the film on the wafer W decreases. In this case, the decrease range of the water content per unit time for the wafer W accommodated within the substrate accommodating unit 20 is smaller than that for the wafer W within the exposure apparatus 3.

For example, the substrate accommodating unit 20 is equipped with a housing 21, a plurality of accommodation shelfs 22 and a supply conduit 23. The housing 21 is configured to isolate an exterior space (transfer space) from an interior space. For example, the housing 21 is a box body having an interior space. At least a part of the housing 21 may have a transfer opening for the wafer W. The housing 21 may be configured to suppress a flow of a gas passing through the opening with an air curtain. The housing 21 accommodates therein the plurality of accommodation shelfs 22, and one end of the housing 21 is connected to the supply conduit 23. The plurality of accommodation shelfs 22 holds a plurality of wafers W, respectively. The supply conduit 23 supplies air for suppressing the variation in the water content into a space within the housing 21. For example, one end of the supply conduit 23 is connected to a device configured to generate dry air having a low humidity, and the low-humidity dry air may be supplied into the housing 21 through the supply conduit 23. The dry air supplied through the supply conduit 23 has a humidity capable of suppressing the variation in the water content in the wafers W accommodated within the substrate accommodating unit 20. For example, the humidity of the dry air supplied through the supply conduit 23 is lower than that in the transfer space and higher than that in the exposure apparatus 3.

Figure 3A:
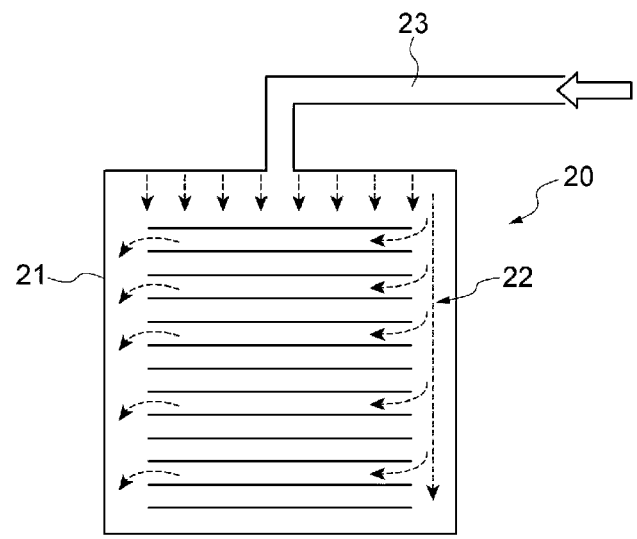
FIG. 3A is a schematic view illustrating an example of a substrate accommodating unit.
Figure 3B:
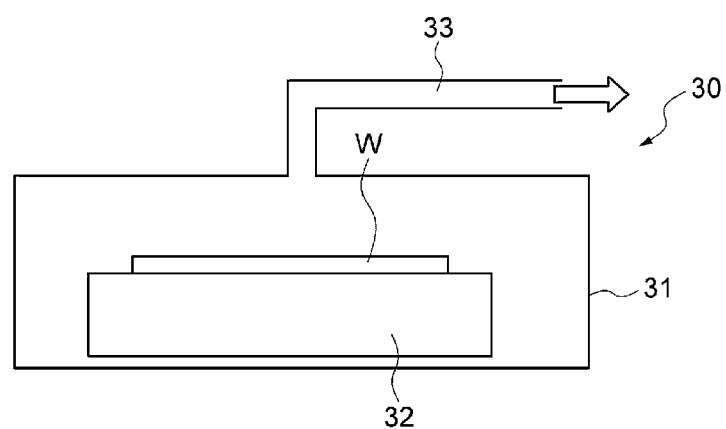
FIG. 3B is a schematic view illustrating an example of a water removing unit.

The water removing unit 30 illustrated in FIG. 3B accommodates therein one or more wafers W, and is configured to decrease the water content of the films on the accommodated wafers W. For example, the water removing unit 30 is equipped with a housing 31, a support plate 32 and a connection conduit 33. The housing 31 is a box body configured to isolate the exterior space (transfer space) from an interior space. The support plate 32 is a plate-shaped member configured to support the wafer W as a water removing target. One end of the connection conduit 33 is connected to the housing 31 and the other end of the connection conduit 33 is connected to a vacuum device (not illustrated). Accordingly, the space within the housing 31 is vacuum-evacuated so that the inside (interior space) of the water removing unit 30 can be maintained in a substantially vacuum state. Since the interior space in the housing 31 is maintained in a substantially vacuum state, the water content of the films on the wafers W accommodated within the water removing unit 30 decreases.

(Control Device)

Referring to FIG. 2 again, the control device 100 controls individual components provided in the coating/developing apparatus 2. The control device 100 is configured to control the processing module 12 to form the metal-containing resist film on the wafer W; the heat treatment unit U8 to perform the heating processing on the wafer W on which the film has been formed and the exposure processing has been performed on the film; and the developing unit U7 to develop the film on the wafer W to which the heating processing has been performed and reduce a difference among the wafers W in the amount of water (hereinafter, referred to as "reaction water amount") that reacts in the film formed on the wafer W during the heating processing.

The control device 100 may be configured to reduce a difference among the wafers W in the water content contained in the metal-containing resist when the heating processing is started in the heat treatment unit U8 in order to reduce the difference among the wafers W in the reaction water amount. In the following description, the water content contained in the metal-containing resist film may be simply referred to as "water content", and the water content when the heating processing is started in the heat treatment unit U8 may be simply referred to as "water content when the heating processing is started".

Figure 4:
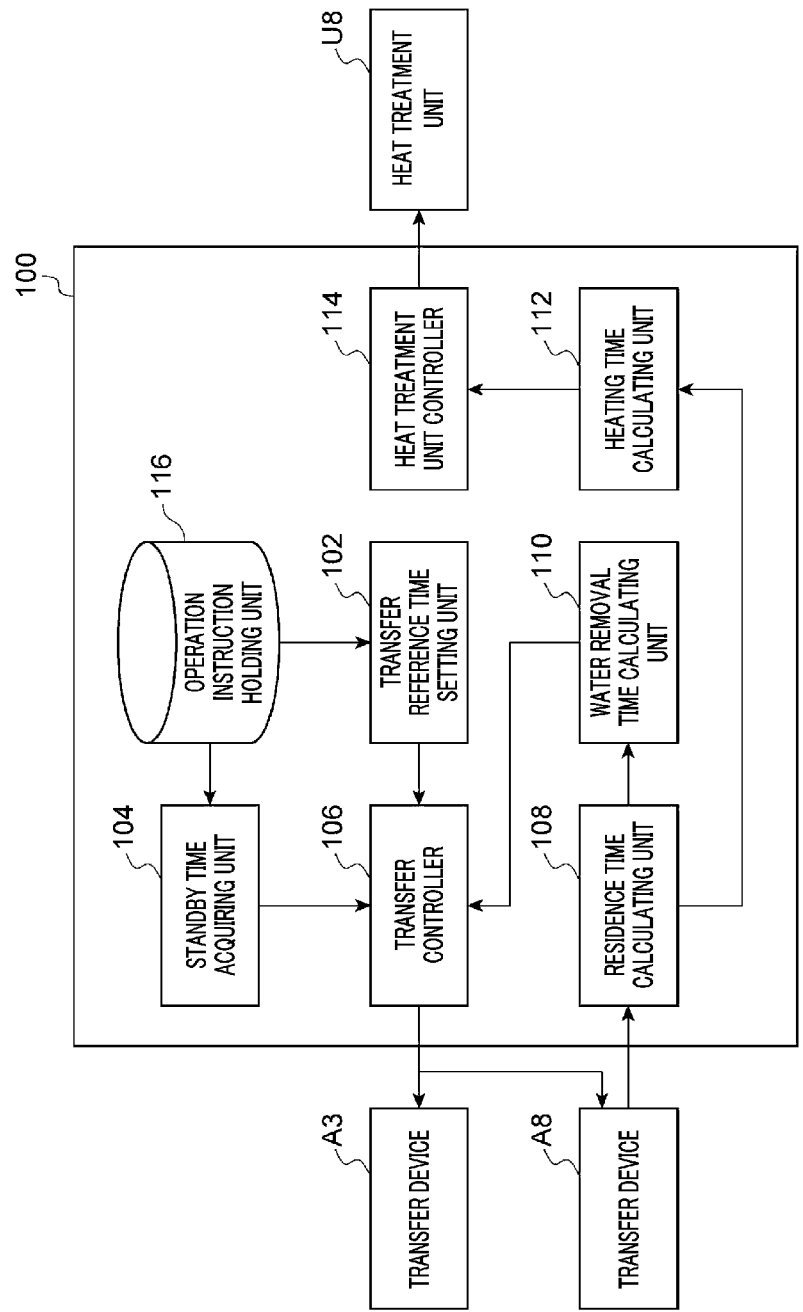
FIG. 4 is a functional block diagram illustrating an example of functional components of a control device.
Figure 5:
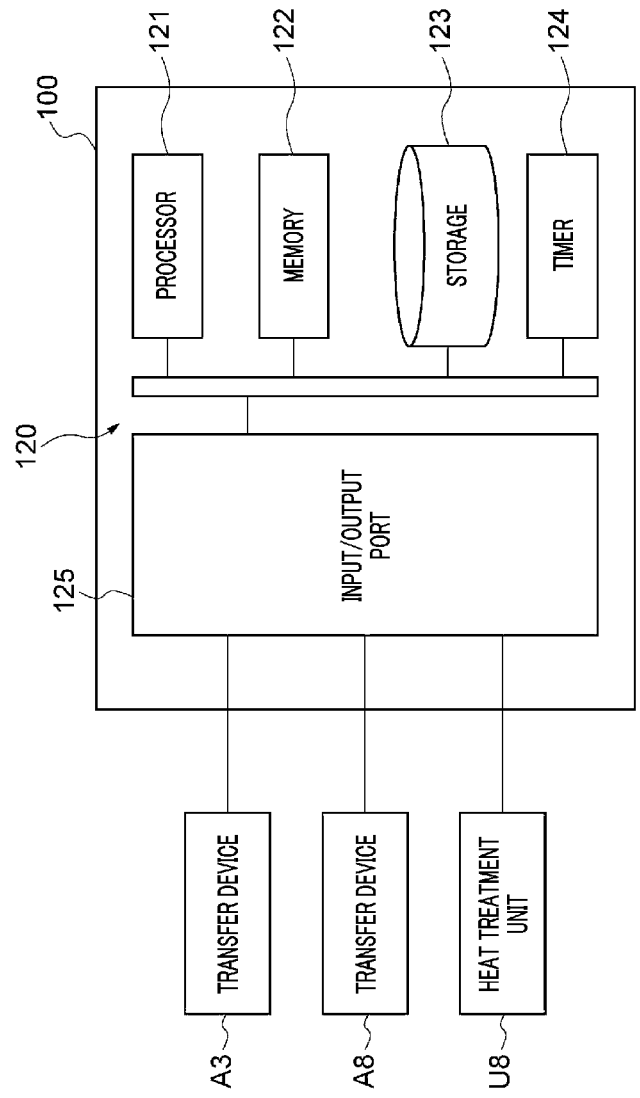
FIG. 5 is a block diagram illustrating an example of a hardware configuration of the control device.

Hereinafter, the specific configuration of the control device 100 will be described. As illustrated in FIG. 4, the control device 100 is equipped with, as functional components (hereinafter, referred to as "functional modules"), a transfer reference time setting unit 102, a standby time acquiring unit 104, a transfer controller 106, a residence time calculating unit 108, a water removal time calculating unit 110, a heat treatment unit controller 114 and an operation instruction holding unit 116. The operation instruction holding unit 116 may hold, e.g., a processing schedule including transfer plans for the wafers W, respectively.

The transfer reference time setting unit 102 is configured to set a transfer reference time. For example, the transfer reference time is a predetermined target value for a time period (accommodation standby time) from the film forming processing on the single wafer W by the processing module 12 to the carry-in of the wafer W into the substrate accommodating unit 20. The accommodation standby time includes a time period during which any one of the transfer devices supports and transfers the corresponding wafer W and a time period during which the corresponding wafer W is not transferred by the corresponding transfer device. The transfer reference time setting unit 102 sets the transfer reference time based on the transfer plans held in the operation instruction holding unit 116. The transfer reference time setting unit 102 outputs the set transfer reference time to the transfer controller 106.

The standby time acquiring unit 104 is configured to acquire an expected standby time. The expected standby time refers to, e.g., a time period during which a wafer W is expected to stay within the shelf unit U11. The standby time acquiring unit 104 acquires the expected standby time for the wafer W in the shelf unit U11 based on the transfer plans held in the operation instruction holding unit 116. The standby time acquiring unit 104 outputs the acquired expected standby time to the transfer controller 106.

The transfer controller 106 is configured to control the transfer device A3 and the transfer device A8 to transfer a wafer W. The transfer controller 106 adjusts the accommodation standby time for each wafer W based on the transfer reference time set by the transfer reference time setting unit 102 and the expected standby time acquired by the standby time acquiring unit 104. For example, the transfer controller 106 calculates an adjustment time based on the transfer reference time, the expected standby time and an expected transfer time. The expected transfer time refers to, e.g., an expected time period required for a wafer W to be transferred by the transfer device A8 from the shelf unit U11 to the substrate accommodating unit 20. The adjustment time refers to a time period to be added to any one of the expected transfer time and the expected standby time to reduce a difference between the wafers W in the accommodation standby time. Specifically, the adjustment time for each wafer W is calculated by subtracting the expected standby time and the expected transfer time from the transfer reference time. The transfer controller 106 may increase the expected standby time or the expected transfer time by the calculated adjustment time. The transfer controller 106 controls the transfer devices A3 and A8 to carry each wafer W into the substrate accommodating unit 20 in the adjusted accommodation standby time.

The residence time calculating unit 108 is configured to calculate a residence time of each of the plurality of wafers W within the exposure apparatus 3. The residence time calculating unit 108 outputs the calculated residence time to the transfer controller 106 and the water removal time calculating unit 110.

The water removal time calculating unit 110 is configured to calculate a water removal time for each wafer W within the water removing unit 30 based on the residence time within the exposure apparatus 3 calculated by the residence time calculating unit 108. The water removal time refers to a time period during which a wafer W stays within the water removing unit 30. The water removal time calculating unit 110 calculates the water removal time for each wafer W to decrease the residence time within the water removing unit 30 as the residence time within the exposure apparatus 3 increases. The water removal time calculating unit 110 outputs the calculated water removal time to the transfer controller 106.

The heat treatment unit controller 114 is configured to control the heating processings performed by the heat treatment unit U8 before and after the developing processing. For example, the heat treatment unit controller 114 controls a heating time for the heating processing in the heat treatment unit U8 based on the processing schedule held in the operation instruction holding unit 116.

The control device 100 is composed of one or more computers for control. For example, the control device 100 includes a circuit 120 illustrated in FIG. 5. The circuit 120 includes one or more processors 121, a memory 122, a storage 123, a timer 124 and an input/output port 125. The storage 123 includes a recording medium such as a hard disk. The recording medium stores a program for executing the following sequence of substrate processings by the control device 100. The recording medium may be a non-volatile semiconductor memory or an extractable medium such as a magnetic disk, an optical disk and the like. The memory 122 temporarily stores the program loaded from the recording medium of the storage 123 and operation results obtained by the processors 121. Each of the processors 121 executes the program in cooperation with the memory 122 to configure the above-described functional modules. The input/output port 125 performs an input/output operation of electrical signals between the transfer devices A3 and A8 and the heat treatment unit U8 in response to instructions from the processors 121. The timer 124 measures an elapsed time by counting, e.g., reference pulses at a predetermined cycle.

Further, the hardware configuration of the control device 100 is not necessarily limited to configuring the functional modules by the program. For example, each of the functional modules of the control device 100 may be configured by a dedicated logic circuit or an application specific integrated circuit (ASIC) in which the dedicated logic circuit is integrated.

[Substrate Processing Sequence]

Hereinafter, the sequence of the substrate processings performed by the coating/developing apparatus 2 will be described as an example of a substrate processing method. This substrate processing sequence includes forming a film (metal-containing resist film) on a wafer W, heating the wafer W on which the film has been formed and an exposure processing has been performed to the film, and developing the film on the wafer W to which the heating processing has been performed. This substrate processing sequence further includes reducing a difference between wafers W in the amount of water that reacts in the film formed on the wafer W during the heating processing performed by the heat treatment unit U8. Hereinafter, an example of the sequence of adjustment (hereinafter, referred to as "reaction water amount adjusting sequence") for reducing the difference between wafers W in the reaction water amount during the heating processing will be described.

In the present exemplary embodiment, the reaction water amount adjusting sequence includes adjusting the water content of each wafer W before the exposure processing by the exposure apparatus 3 and adjusting the water content of each wafer W after the exposure processing by the exposure apparatus 3. As an example of adjusting the water content before the exposure processing, the control device 100 controls the transfer device A8 to carry the wafer W having the film thereon into the substrate accommodating unit 20. Also, the control device 100 controls the transfer device A8 to reduce the difference between the wafers W in the time period from when the wafer W is carried out of the processing module 12 to when the wafer W is carried into the substrate accommodating unit 20. In other words, the control device 100 adjusts the accommodation standby time from the formation of the film on the wafer W by the processing module 12 to the accommodation of the wafer W into the substrate accommodating unit 20 to adjust the water content of each wafer W.

Figure 6:
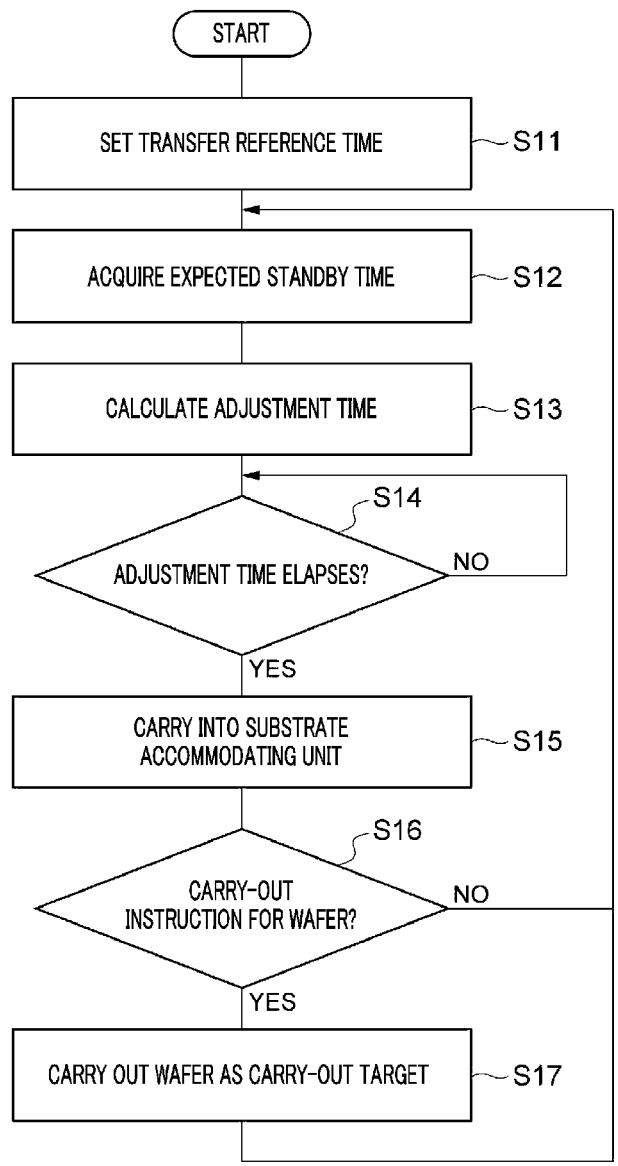
FIG. 6 is a flowchart showing an example sequence of adjusting a water content.

FIG. 6 is a flowchart showing an example adjusting sequence of the water content before the exposure processing. According to this adjusting sequence, the control device 100 performs a process S11. In the process S11, the transfer reference time setting unit 102 sets the transfer reference time based on the transfer plans stored in the operation instruction holding unit 116. For example, the transfer reference time setting unit 102 may set, as the transfer reference time, the longest one of the time periods on the transfer plans from the formation of the films on the wafers W by the processing module 12 to the accommodation of the wafers W into the substrate accommodating unit 20. Otherwise, the transfer reference time setting unit 102 may set, as the transfer reference time, the reference time that has been previously input into the operation instruction holding unit 116 by an operator. The transfer reference time setting unit 102 outputs the set transfer reference time to the transfer controller 106.

Then, the control device 100 performs a process S12. In the process S12, the standby time acquiring unit 104 acquires the expected standby time based on the transfer plans stored in the operation instruction holding unit 116. For example, the standby time acquiring unit 104 acquires, from the operation instruction holding unit 116, the expected standby time for the wafer W in the shelf unit U11 which is an adjusting target and included in the transfer plans. The transfer plans include an expected carry-in time into the shelf unit U11 and an expected carry-out time from the shelf unit U11. The standby time acquiring unit 104 calculates the expected standby time from a difference between the expected carry-in time into the shelf unit U11 and the expected carry-out time from the shelf unit U11. The standby time acquiring unit 104 outputs the acquired expected standby time to the transfer controller 106.

Thereafter, the control device 100 performs a process S13. In the process S13, the transfer controller 106 calculates the adjustment time for each wafer W which is a transferring target. For example, the transfer controller 106 calculates the adjustment time for each wafer W based on the transfer reference time set by the transfer reference time setting unit 102, the expected standby time acquired by the standby time acquiring unit 104 and the already-known transfer time. The already-known transfer time refers to a time period from when the wafer W is carried out of the shelf unit U11 by the transfer device A8 to when the wafer W is carried into the substrate accommodating unit 20, and is approximately constant for each wafer W. The transfer controller 106 calculates the adjustment time by subtracting the expected standby time and the transfer time from the transfer reference time.

Then, the control device 100 performs processes S14 and S15. In the process S14, for example, the transfer controller 106 controls the transfer device A8 to make the wafer W stay in the shelf unit U11 for a time period longer by the adjustment time than the expected standby time. In other words, the transfer controller 106 controls the transfer device A8 to stand by for the adjustment time to take out the wafer W from the shelf unit U11. In the process S14, when the adjustment time elapses, the control device 100 performs the process S15. In the process S15, the transfer controller 106 controls the transfer device A8 to carry the wafer W out of the shelf unit U11 and carry the wafer W into the substrate accommodating unit 20. Accordingly, it is possible to calculate the adjustment time for each wafer W depending on the standby time in the shelf unit U11, and it is possible to reduce the difference between the wafers W in the accommodation standby time from the formation of the film by the processing module 12 to the accommodation into the substrate accommodating unit 20.

Also, the transfer controller 106 may adjust a transfer speed of the transfer device A8 according to the adjustment time without changing the expected standby time in the shelf unit U11. The transfer controller 106 may reduce the difference between the wafers W in the accommodation standby time by changing the transfer speed of the transfer device A8 to increase the expected transfer time by the adjustment time. The operation instruction holding unit 116 may store an operation instruction in which the accommodation standby time has already been adjusted, and the transfer controller 106 may adjust the accommodation standby time for each wafer W by performing the transfer based on the operation instruction.

Then, the control device 100 performs a process S16. In the process S16, the transfer controller 106 determines whether a carry-out instruction for the wafer W has been received from the operation instruction holding unit 116. When the transfer controller 106 has not received the carry-out instruction, the processes S12 to S16 are repeated. Accordingly, the accommodation standby time for each of the wafers W is adjusted to the transfer reference time, and the wafers W are accommodated in the substrate accommodating unit 20.

In the process S16, when the transfer controller 106 has received the carry-out instruction, the control device 100 performs a process S17. In the process S17, the transfer controller 106 controls the transfer device A8 to carry out the wafer W which is a carry-out target. For example, the transfer controller 106 carries out, as the carry-out target, the wafer W that has stayed within the substrate accommodating unit 20 for the longest time. The transfer controller 106 controls the transfer device A8 to deliver the wafer W carried out of the substrate accommodating unit 20 to the exposure apparatus 3. The timing of carrying the wafer W into the exposure apparatus 3 may be defined according to the timing of the exposure processing to be performed by the exposure apparatus 3. For this reason, a standby time for each wafer W to be carried into the exposure apparatus 3 varies depending on the timing of the exposure processing to be performed by the exposure apparatus 3. Thus, if the wafer W stands by in the transfer space except the substrate accommodating unit 20, the water content may vary (increase). In this regard, in the substrate accommodating unit 20, even if the residence time is different, the difference between the wafers W in the water content due to the standby time is unlikely to occur. Therefore, the control device 100 sets the wafer W on standby in the substrate accommodating unit 20 to reduce the difference in the water content.

Figure 7:
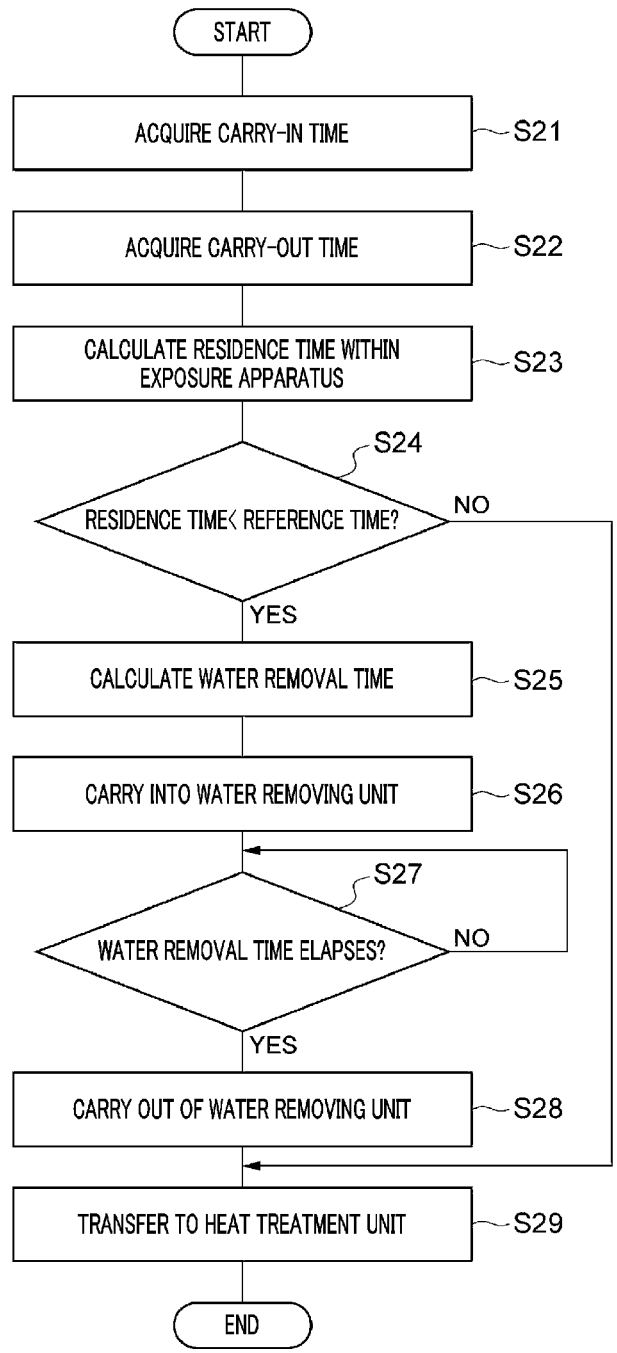
FIG. 7 is a flowchart showing another example sequence of adjusting the water content.

Hereinafter, an example adjusting sequence of the water content after the exposure processing will be described. FIG. 7 is a flowchart showing a sequence of adjusting a water removal time within the water removing unit 30. The control device 100 controls the transfer device A8 to carry at least some of the wafers W into the water removing unit 30 after the exposure processing and carry the wafers W out of the water removing unit 30 at the timing set to increase the residence time of the wafers W within the water removing unit 30 as the residence time within the exposure apparatus 3 decreases.

As illustrated in FIG. 7, the control device 100 performs a process S21. In the process S21, the residence time calculating unit 108 acquires a time (carry-in time) for the wafer W to be carried into the exposure apparatus 3. The control device 100 stands by until the exposure processing on the wafer W in the exposure apparatus 3 is ended, and then, performs a process S22. In the process S22, the residence time calculating unit 108 acquires a time (carry-out time) for the wafer W to be carried out of the exposure apparatus 3.

Then, the control device 100 performs a process S23. In the process S23, the residence time calculating unit 108 calculates the residence time of the wafer W, which has been carried out of the exposure apparatus 3, within the exposure apparatus 3. For example, the residence time calculating unit 108 calculates, as the residence time within the exposure apparatus 3, a difference between the carry-out time acquired in the process S22 and the carry-in time acquired in the process S21. The residence time calculating unit 108 outputs the calculated residence time to the water removal time calculating unit 110.

Then, the control device 100 performs a process S24. In the process S24, the control device 100 determines whether the residence time calculated by the residence time calculating unit 108 is smaller than a predetermined reference time. The reference time may be a maximum residence time within the exposure apparatus 3 or a saturate time for the water content. The saturate time refers to a time period during which the wafer W needs to stay within the exposure apparatus 3 in order to reduce the decrease range of the water content per unit time to a predetermined threshold value. In the process S24, if it is determined that the residence time is equal to or greater than the reference time, the control device 100 performs a process S29. Details of the processing in the process S29 will be described later.

In the process S24, if it is determined that the residence time is smaller than the reference time (e.g., saturate time), the control device 100 performs a process S25. In the process S25, the water removal time calculating unit 110 calculates the water removal time within the water removing unit 30 based on the residence time calculated by the residence time calculating unit 108. Herein, the water removal time refers to a time period during which the wafer W stays within the water removing unit 30. For example, the water removal time calculating unit 110 calculates the water removal time for each wafer W within the water removing unit 30 based on the residence time of the wafer W within the exposure apparatus 3. The water removal time calculating unit 110 calculates the water removal time to decrease the water removal time as the residence time within the exposure apparatus 3 increases. In other words, the water removal time calculating unit 110 calculates the water removal time to increase the water removal time as the residence time within the exposure apparatus 3 decreases. The water removal time calculating unit 110 may calculate, as the water removal time, a difference between the reference time and the residence time. Otherwise, the water removal time calculating unit 110 may calculate, as the water removal time, a value obtained by performing a predetermined correction processing to the corresponding difference. The water removal time calculating unit 110 may calculate the water removal time within the water removing unit 30 by referring a table that has been previously stored in the storage 123 and in which the residence time within the exposure apparatus 3 is matched with the water removal time. The water removal time calculating unit 110 outputs the calculated water removal time to the transfer controller 106.

Then, the control device 100 performs a process S26. In the process S26, the transfer controller 106 carries the wafer W, which is the adjusting target, into the water removing unit 30. For example, the transfer controller 106 controls the transfer device A8 to carry the wafer W, which is the adjusting target and carried out of the exposure apparatus 3, into the water removing unit 30.

Then, the control device 100 performs a process S27. In the process S27, the control device 100 stands by until the water removal time calculated (set) for the wafer W which is the adjusting target elapses. When the water removal time elapses, the control device 100 performs a process S28. In the process S28, for example, the transfer controller 106 controls the transfer device A8 to carry the wafer W, which has stayed within the water removing unit 30 for the calculated the water removal time, out of the water removing unit 30.

Then, the control device 100 performs a process S29. In the process S29, the transfer controller 106 controls the transfer device A8 and the transfer device A3 to transfer the wafer, which is the transfer target, to the heat treatment unit U8. If it is determined that the residence time within the exposure apparatus 3 is equal to or greater than the reference time in the process S22, the transfer controller 106 controls the transfer devices A3 and A8 to transfer the wafer W from the exposure apparatus 3 to the heat treatment unit U8 without passing through the water removing unit 30.

In this manner, the adjusting sequence of the reaction water amount (water content) after the exposure processing to each wafer W is ended. The control device 100 performs the processes S21 to S29 to each wafer W. Further, the control device 100 may carry all of wafers W, which are the adjusting targets, into the water removing unit 30 and adjust the water removal time for each of the wafers W without performing the determination processing in the process S24. After the water removal time is adjusted and the wafer W is carried into the heat treatment unit U8, the heat treatment unit controller 114 may control the heat treatment unit U8 to perform the heating processing on the wafer W for a predetermined heating time held in the operation instruction holding unit 116.

Effects of Exemplary Embodiment

The above-described coating/developing apparatus 2 according to the present exemplary embodiment includes the coating unit U3 and the heat treatment unit U4 configured to form the film on the wafer W; the heat treatment unit U8 configured to perform the heating processing toon the wafer W on which the film has been formed and the exposure processing has been performed on the film; the developing unit U7 configured to perform the developing processing to the film on the wafer W to which the heating processing has been performed; and the control device 100 configured to reduce the difference between the wafers Win the amount of water that reacts in the film formed on the wafer W during the heating processing in the heat treatment unit U8.

In the coating/developing apparatus 2, the difference between the wafers W in the amount of water (reaction water amount) that reacts in the film formed on the wafer W during the heating processing in the heat treatment unit U8 is reduced by the control device 100. The dimension of the resist pattern formed by using the metal-containing resist is likely to be affected by the water content that reacts in the film during the heating processing before the developing processing. For this reason, when the reaction water amount is different for each wafer W, the resist pattern formed between the wafers W is likely to have non-uniformity in dimension. In this regard, in the coating/developing apparatus 2, the difference in the reaction water amount at the time of heating processing on the wafer W to which the exposure processing has been performed is reduced by the control device 100, and, thus, the resist pattern formed between the wafers W is unlikely to have non-uniformity in dimension. As a result, the coating/developing apparatus 2 is effective in improving the dimensional stability of the resist pattern formed by using the metal-containing resist.

The control device 100 reduces the difference between the wafers W in the water content contained in the film when the heating processing is started in the heat treatment unit U8. In this case, the difference in the water content contained in the film when the heating processing is started in the heat treatment unit U8 is reduced, and, thus, the difference in the above-described reaction water amount is reduced. As a result, the dimensional stability of the resist pattern formed by using the metal-containing resist can be improved.

The control device 100 adjusts the water content of each wafer W at least before the exposure processing to reduce the difference between the wafers W in the water content when the heating processing is started in the heat treatment unit U8. The dimension of the resist pattern is also affected by the water content at the time of the exposure processing. In the above-described configuration, the water content is adjusted before the exposure processing, and, thus, the difference between the wafers W in the water content at the time of the exposure processing can be reduced. As a result, the dimensional stability of the resist pattern can be more securely improved.

The coating/developing apparatus 2 further includes the transfer devices A3 and A8 configured to transfer the wafer W; and the substrate accommodating unit 20 configured to suppress the variation in the water content as compared with the transfer spaces where the transfer devices A3 and A8 are accommodated. The control device 100 controls the transfer devices A3 and A8 to carry the wafer W, on which the film has been formed by the coating unit U3 and the heat treatment unit U4 but the exposure processing has not yet been performed, into the substrate accommodating unit 20. A time period until the wafer W is transferred to the exposure apparatus 3 after the heat treatment (film formation) is performed by the heat treatment unit U4 may be different for each wafer W. In the above-described configuration, the wafer W stands by in a space where the variation in the water content of the film is suppressed, and, thus, the variation in the water content of the wafer W with long standby time before being transferred into the exposure apparatus 3 can be suppressed. As a result, the difference between the wafers W in the water content can be reduced so that the dimensional stability of the resist pattern can be improved.

The control device 100 controls the transfer devices A3 and A8 to reduce the difference between the wafers W in the time period from when the wafer W is carried out of the heat treatment unit U4 to when the wafer W is carried into the substrate accommodating unit 20. The water content of the film may vary during the transfer until the wafer W is carried into the substrate accommodating unit 20 after the heat treatment (film formation) is performed by the heat treatment unit U4. For this reason, the difference between the wafers W in the transfer time from the heat treatment unit U4 to the substrate accommodating unit 20 can make the difference between the wafers W in the water content. In the above-described configuration, the difference between the wafers W in the transfer time from the heat treatment by the heat treatment unit U4 to the carry-in of the wafer W into the substrate accommodating unit 20 can be reduced. Therefore, the difference between the wafers W in the water content caused by the transfer time can be reduced. As a result, the dimensional stability of the resist pattern can be more securely improved.

The control device 100 adjusts the water content of each wafer W at least after the exposure processing by the exposure apparatus 3 to reduce the difference between the wafers W in the water content when the heating processing is started in the heat treatment unit U8. The water content may vary even in the exposure apparatus 3. In the above-described configuration, since the water content of each wafer W is adjusted at least after the exposure processing, the difference between the wafers W in the water content including the difference between the wafers W in the water content caused by the exposure apparatus 3 can be reduced.

As a result, the dimensional stability of the resist pattern formed by using the metal-containing resist can be more securely improved.

The control device 100 adjusts the water content of each wafer W after the exposure processing, based on the residence time within the exposure apparatus 3. In the exposure apparatus 3, the difference between the wafers W in the residence time makes the difference between the wafers W in the water content. In the above-described configuration, the difference between the wafers W in the water content is adjusted based on the residence time within the exposure apparatus 3, and, thus, the difference between the wafers W in the water content caused by the residence within the exposure apparatus 3 can be reduced. As a result, the dimensional stability of the resist pattern formed by using the metal-containing resist can be improved.

The control device 100 controls the transfer device A8 to carry at least some of the wafers W into the water removing unit 30 after the exposure processing and carry the wafers W out of the water removing unit 30 at the timing set to increase the residence time (water removal time) of the wafer W within the water removing unit 30 as the residence time within the exposure apparatus 3 decreases. As the residence time of the wafer W within the exposure apparatus 3 decreases, the water content of the wafer W does not decrease. In the above-described configuration, as the residence time of the wafer W within the exposure apparatus 3 decreases, the residence time within the water removing unit 30 increases. Therefore, the water content of the film on the wafer W further decreases. Accordingly, the difference between the wafers W in the water content is reduced, and, thus, the dimensional stability of the resist pattern formed by using the metal-containing resist can be improved.

So far, the exemplary embodiment has been described. However, the present disclosure is not necessarily limited to the above-described exemplary embodiment, and various changes and modifications may be made without departing from the spirit and scope of the present disclosure.

Modification Example of First Exemplary Embodiment

An adjusting method of the water content after the exposure processing is not limited to the above-described method using the water removing unit 30. For example, the control device 100 may adjust the water content of the wafer W after the exposure processing by using a humidifying unit (humidifier) 40 instead of the water removing unit 30.

For example, the humidifying unit 40 (configuration example is not illustrated) is equipped with a housing, a support plate and a supply conduit. The housing has an interior space and supports the support plate. The support plate supports a wafer W. The supply conduit is connected to one end of the housing and supplies air which is humidified (humidified air) into the housing. A humidification environment (e.g., increase range of water content per unit time) in the humidifying unit 40 may be maintained approximately constant by adjusting the supply of the humidified air with the control device 100.

The control device 100 controls the transfer device A8 to carry at least some of wafers W (including all wafers W) into the humidifying unit 40 after the exposure processing and carry the wafers W out of the humidifying unit 40 at the timing set to increase the residence time of the wafers W within the humidifying unit 40 as the residence time within the exposure apparatus 3 increases. A flowchart showing an adjusting sequence of a humidification time within the humidifying unit 40 (residence time within the humidifying unit 40) is omitted.

For example, to adjust the humidification time, the residence time calculating unit 108 calculates first the residence time within the exposure apparatus 3 as in the process S21. Then, the control device 100 calculates the humidification time within the humidifying unit 40 based on the residence time within the exposure apparatus 3. The control device 100 calculates the humidification time in order to increase the humidification time within the humidifying unit 40 as the residence time within the exposure apparatus 3 increases. In other words, the control device 100 calculates the humidification time to decrease the humidification time within the humidifying unit 40 as the residence time within the exposure apparatus 3 decreases. Further, the transfer controller 106 controls the transfer device A8 to carry the wafer W into the humidifying unit 40.

When the calculated humidification time elapses after the wafer W is carried into the humidifying unit 40, the transfer controller 106 controls the transfer device A8 to carry the wafer W out of the humidifying unit 40. Further, the transfer controller 106 controls the transfer devices A3 and A8 to carry the wafer W into the heat treatment unit U8. Then, the heat treatment unit controller 114 controls the heat treatment unit U8 to perform the heating processing on the wafer W based on the operation instruction from the operation instruction holding unit 116. The control device 100 performs the adjustment of the humidification time on each wafer W to adjust the water content of each wafer W after the exposure processing.

In this modification example, the control device 100 controls the transfer device A8 to carry at least some of wafers W into the humidifying unit 40 after the exposure processing and carry the wafers W out of the humidifying unit 40 at the timing set to increase the residence time (humidification time) of the wafers W within the humidifying unit 40 as the residence time within the exposure apparatus 3 increases. As the residence time of the wafer W within the exposure apparatus 3 increases, the water content of the wafer W decreases. In the above-described configuration, as the residence time of the wafer W within an apparatus for the exposure processing increases, the residence time within the humidifying unit increases. Therefore, the water content on the wafer W further increases. Accordingly, the difference between the wafers W in the water content can be reduced, and, thus, the dimensional stability of the resist pattern formed by using the metal-containing resist can be improved.

The control device 100 may adjust the water content by using both the water removing unit 30 and the humidifying unit 40 after the exposure processing.

The control device 100 may adjust the water content by using any one of the water removing unit 30 and the humidifying unit 40, and thus may not perform the adjustment of the water content according to the adjustment of the substrate accommodating unit 20 and the transfer time. In this case, the coating/developing apparatus 2 may not include the substrate accommodating unit 20.

The control device 100 may perform the adjustment of the water content according to the adjustment of the substrate accommodating unit 20 and the transfer time (accommodation standby time), and thus may not adjust the water content by using the water removing unit 30 and the humidifying unit 40. In this case, the coating/developing apparatus 2 may not include the water removing unit 30 and the humidifying unit 40. The control device 100 may not perform the adjustment of the water content according to the adjustment of the transfer time, and may allow the wafer W to be accommodated in the substrate accommodating unit 20 to adjust the water content before the exposure processing. For example, the difference between the wafers W in the standby time caused by the operation of the transfer device A8 within the coating/developing apparatus 2 may be smaller than the difference between the wafers W in the standby time caused by the processing timing in the exposure apparatus 3. In this case, it is possible to sufficiently adjust the water content even without the adjustment of the transfer time. In this case, the adjustment of the transfer time is not performed, and, thus, the processing load of the control device 100 can be reduced.

Second Exemplary Embodiment

Hereinafter, a substrate processing system 1 according to a second exemplary embodiment will be described with reference to FIG. 8. The substrate processing system 1 (coating/developing apparatus 2) according to the second exemplary embodiment is different from the substrate processing system 1 according to the first exemplary embodiment in that the control device 100 includes a heating time calculating unit 112 instead of the water removal time calculating unit 110, and an adjusting sequence of the reaction water amount carried out by the control device 100 is different.

The control device 100 adjusts a heating time in the heat treatment unit U8 based on the residence time within the exposure apparatus 3. Specifically, the control device 100 may control the heat treatment unit U8 to increase the heating time for the wafer W as the residence time within the exposure apparatus 3 increases. The heating time calculating unit 112 of the control device 100 calculates the heating time for each wafer W in the heating processing performed by the heat treatment unit U8 based on the residence time within the exposure apparatus 3 calculated by the residence time calculating unit 108. The heating time calculating unit 112 outputs the calculated heating time to the heat treatment unit controller 114. The heat treatment unit controller 114 may control the heat treatment unit U8 to perform a heating processing before a developing processing for the heating time calculated by the heating time calculating unit 112.

Figure 8:
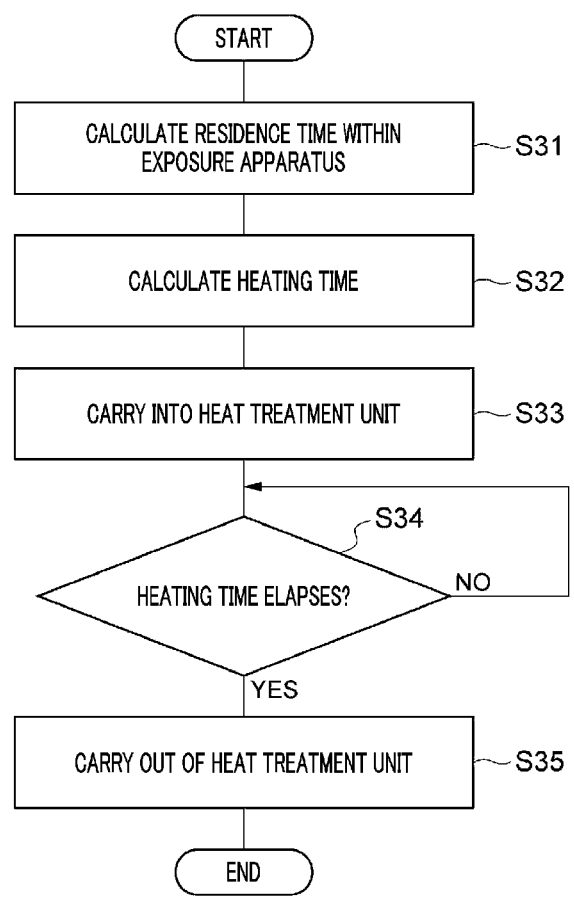
FIG. 8 is a flowchart showing an example sequence of adjusting a reaction water amount in a substrate processing system according to a second exemplary embodiment.

FIG. 8 is a flowchart showing an adjusting sequence of the heating time within the heat treatment unit U8. As shown in FIG. 8, according to the adjusting sequence of the heating time, the control device 100 performs first a process S31. In the process S31, the residence time calculating unit 108 acquires a carry-in time into the exposure apparatus 3 and a carry-out time from the exposure apparatus 3, and calculates a residence time within the exposure apparatus 3 as in the process S23. The residence time calculating unit 108 outputs the calculated residence time within the exposure apparatus 3 to the heating time calculating unit 112.

Then, the control device 100 performs a process S32. In the process S32, the heating time calculating unit 112 calculates the heating time in the heat treatment unit U8 based on the residence time calculated by the residence time calculating unit 108. Herein, the heating time refers to a time period during which the heat treatment is performed in the heat treatment unit U8 before the developing processing on the wafer W. For example, the heating time calculating unit 112 calculates the heating time for the wafer W in the heat treatment unit U8 based on the residence time of the wafer W within the exposure apparatus 3. The heating time calculating unit 112 calculates the heating time to increase the heating time as the residence time within the exposure apparatus 3 increases. In other words, the heating time calculating unit 112 calculates the heating time to decrease the heating time as the residence time within the exposure apparatus 3 decreases. The heating time calculating unit 112 may calculate the heating time within the heat treatment unit U8 by referring a table that has been previously stored in the storage 123 and in which the residence time within the exposure apparatus 3 is matched with the heating time. The heating time calculating unit 112 outputs the calculated heating time to the heat treatment unit controller 114.

Then, the control device 100 performs a process S33. In the process S33, the transfer controller 106 controls the transfer devices A3 and A8 to carry the wafer into the heat treatment unit U8. After the wafer W is carried into the heat treatment unit U8 by the transfer device A3, the heat treatment unit controller 114 controls the heat treatment unit U8 to start the heating processing on the wafer W.

Then, the control device 100 performs a process S34. In the process S34, the heat treatment unit controller 114 stands by until the heating time calculated by the heating time calculating unit 112 elapses. When the heating time elapses, the control device 100 performs a process S35. In the process S35, for example, the transfer controller 106 controls the transfer device A3 to carry the wafer W, on which the heating processing has been performed for the heating time calculated (set) by the heating time calculating unit 112, out of the heat treatment unit U8. Also, after the wafer W on which the heating processing has been performed for the heating time is cooled on a cooling plate within the heat treatment unit U8, the transfer controller 106 may control the transfer device A8 to carry the wafer W out of the heat treatment unit U8.

In this manner, the adjusting sequence of the heating time for each wafer W is ended. The control device 100 repeats the processings of the processes S31 to S35 to each wafer W. After the processing of the process S35, the transfer controller 106 controls the transfer device A3 to carry the wafer W, which has been carried out of the heat treatment unit U8, into the developing unit U7. Then, the control device 100 controls the developing unit U7 to perform the developing processing on the wafer W. After the developing processing, the control device 100 may control the transfer device A3 and the heat treatment unit U8 to perform the heating processing on the wafer W in the heat treatment unit U8 after the developing processing.

In the coating/developing apparatus 2 of the substrate processing system 1 according to the second exemplary embodiment, the control device 100 controls the heat treatment unit U8 to increase the heating time for the wafer W as the residence time of the wafer W within the exposure apparatus 3 increases. In this case, as the residence time within the exposure apparatus 3 increases, the water content decreases. Thus, the heating time within the heat treatment unit U8 increases. Further, as the residence time within the exposure apparatus 3 decreases, the water content increases. Thus, the heating time within the heat treatment unit U8 decreases. Therefore, even if there is the difference in the residence time within the exposure apparatus 3, the difference between the wafers in the reaction water amount during the heating processing in the heat treatment unit U8 can be reduced. As a result, the dimensional stability of the resist pattern formed by using the metal-containing resist can be improved.

In addition to the adjustment of the heating time in the heat treatment unit U8, the control device 100 may perform the adjustment of the water content according to the adjustment of the substrate accommodating unit 20 and the transfer time before the exposure processing, as in the first exemplary embodiment. The control device 100 may adjust the heating time in the heat treatment unit U8 and may not perform the adjustment of the water content according to the adjustment of the substrate accommodating unit 20 and the transfer time before the exposure processing. In this case, even if the apparatus (humidity adjusting mechanism 7) configured to adjust the reaction water amount is not provided, the reaction water amount can be adjusted. Thus, both the dimensional stability and the simplification of the coating/developing apparatus 2 can be achieved. Further, the control device 100 may combine the adjustment of the heating time according to the second exemplary embodiment with the adjustment performed by the water removing unit 30 or the humidifying unit 40 according to the first exemplary embodiment.

Third Exemplary Embodiment

Hereinafter, a substrate processing system 1 according to a third exemplary embodiment will be described with reference to FIG. 9. The substrate processing system 1 (coating/developing apparatus 2) according to the third exemplary embodiment is different from the substrate processing system 1 according to the first exemplary embodiment in an adjusting sequence of a water content by the control device 100 before an exposure processing. The control device 100 adjusts the water content with the water removing unit 30 before the exposure processing. In this case, the control device 100 controls the transfer device A8 to carry the wafer W, on which the exposure processing has not yet been performed by the exposure apparatus 3, into the water removing unit 30 after a heat treatment (film formation) is performed by the heat treatment unit U4. Then, the control device 100 controls the transfer device A8 to carry the wafer W out of the water removing unit 30 at the timing set to reduce a difference between the wafers W in the water content when the wafer W is carried out of the water removing unit 30 as compared with when the wafer W is carried into the water removing unit 30.

Figure 9:
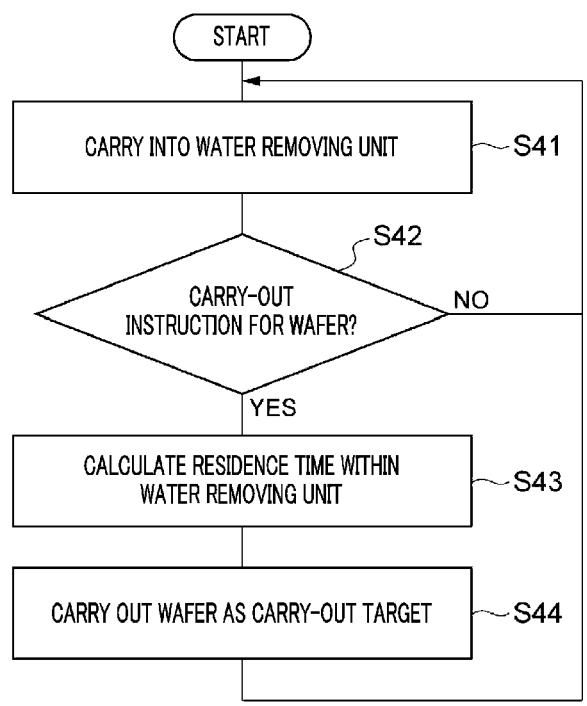
FIG. 9 is a flowchart showing an example sequence of adjusting a water content in a substrate processing system according to a third exemplary embodiment.

FIG. 9 shows an adjusting sequence of a carry-out timing from the water removing unit 30 (residence time within the water removing unit 30) as an example adjusting sequence by the water removing unit 30 before an exposure processing. According to this adjusting sequence, the control device 100 performs a process S41. In the process S41, for example, the transfer controller 106 controls the transfer device A8 to sequentially carry the wafers W from the shelf unit U11 into the dehydrating unit 30 based on the transfer plans held in the operation instruction holding unit 116.

Then, the control device 100 performs a process S42. In the process S42, the transfer controller 106 determines whether a carry-out instruction for the wafers W has been received from the operation instruction holding unit 116. When the transfer controller 106 has not received the carry-out instruction, the processes S41 and S42 are repeated. Accordingly, the wafers W are carried into the dehydrating unit 30.

In the process S42, when the transfer controller 106 has received the carry-out instruction, the control device 100 performs a process S43. In the process S43, for example, the control device 100 calculates the residence time of each of the wafers W accommodated in the dehydrating unit 30 at this time point. Then, the control device 100 performs a process S44. In the process S44, the transfer controller 106 controls the transfer device A8 to carry out the wafers W which are the carry-out targets. Specifically, the transfer controller 106 controls the transfer device A8 to carry out, as the carry-out target, the wafer W that has stayed within the dehydrating unit 30 for the longest time. After the wafer W is carried out of the water removing unit 30, the transfer controller 106 controls the transfer device A8 to carry the wafer W into the exposure apparatus 3.

The control device 100 repeats the processes S41 to S44. Through these processings, whenever the carry-out instruction is received, the wafer with longest residence time is carried out. Therefore, the water content of each wafer W carried into the exposure apparatus 3 through the water removing unit 30 reaches a saturate level (decrease range per unit time is lowered to a predetermined threshold value). For this reason, the difference between the wafers W in the water content when the wafer W is carried out of the water removing unit 30 is reduced as compared with when the wafer W is carried into the water removing unit 30. Also, if the wafers W accommodated in the water removing unit 30 are small in number and all the wafers W do not reach the saturate level, the control device 100 may stand by until the wafers W are carried out of the water removing unit 30.

The control device 100 may control the transfer device A8 to adjust the residence time (water removal time) within the water removing unit 30 according to the transfer time from the heat treatment unit U4 to the water removing unit 30, instead of performing the above-described processing in the process S44. For example, the control device 100 may control the transfer device A8 to carry the wafer W out of the water removing unit 30 at the timing set to increase the residence time within the water removing unit 30 as the transfer time to the water removing unit 30 increases. Further, the control device 100 may adjust the reaction water amount in the same sequence as described above by using the humidifying unit 40 instead of the water removing unit 30.

In the coating/developing apparatus 2 of the substrate processing system 1 according to the third exemplary embodiment, the control device 100 controls the transfer device A8 to carry the wafer W, on which an exposure processing has not yet been performed, into the water removing unit 30 after a heat treatment (film formation) is performed by the heat treatment unit U4. If the wafer W is carried into the water removing unit 30 and the water content of the wafer W decreases, the decrease in the water content becomes stagnant (in a stagnant state) at a certain level. For this reason, the wafer W is carried into the water removing unit 30 and then guided to the exposure apparatus 3, and, thus, a difference between the maximum value and the minimum value of the water content between the wafers W can be reduced. Accordingly, the difference between the wafers W in the water content can be reduced, and, thus, the dimensional stability of the resist pattern can be improved.

The control device 100 controls the transfer device A8 to carry the wafer W out of the water removing unit 30 at the time set to reduce the difference between the wafers W in the water content when the wafer W is carried out of the water removing unit 30 as compared with when the wafer W is carried into the water removing unit 30. For example, the wafer W is carried out of the water removing unit 30 when the water content of all wafers W within the water removing unit 30 reaches the saturate level. For this reason, even if the wafer W with the stagnant decrease in the water content is carried into the exposure apparatus 3, the water content of the wafer W within the exposure apparatus 3 decreases a little bit regardless of the length of residence time. Accordingly, the difference between the wafers W in the water content caused by the residence time within the exposure apparatus 3 is suppressed, and, thus, the difference between the wafers W in the water content can be reduced. Otherwise, the difference between the wafers W in the water content can be reduced by changing the residence time within the water removing unit 30 depending on the transfer time to the water removing unit 30 (e.g., by increasing the residence time as the transfer time increases). As a result, the dimensional stability of the resist pattern can be more securely promoted.

In the third exemplary embodiment, the control device 100 may adjust the water content within the water removing unit 30 to reach the saturate level before the exposure processing and may not adjust the reaction water amount (water content) after the exposure processing with respect to each of the wafers W. In the substrate processing system 1, the throughput of the coating/developing apparatus 2 may be greater than that of the exposure apparatus 3. In this case, the total throughput of the substrate processing system 1 is determined by the exposure apparatus 3. Thus, in terms of production efficiency, it may be effective to smoothly perform the processings (minimum processes required for the production of wafers W) on the wafer W after the exposure processing in the exposure apparatus 3. For this reason, to achieve both the adjustment of the water content and the production efficiency, the coating/developing apparatus 2 may be configured so that the adjustment of the water content is performed by the control device 100 before, but not after, the exposure processing.

The control device 100 may combine at least one of the adjustment performed by the water removing unit 30 or the humidifying unit 40 according to the first exemplary embodiment and the adjustment of the heating time according to the second exemplary embodiment with the adjustment performed by the water removing unit 30 according to the third exemplary embodiment. For example, the control device 100 may perform the adjustment of the water content by the water removing unit 30 after the exposure processing in addition to the adjustment of the water content by the water removing unit 30 before the exposure processing. In this case, the coating/developing apparatus 2 may include two different water removing units 30. For example, the control device 100 may adjust the reaction water amount by performing the adjustment of the heating time by the heat treatment unit U8 after the exposure processing in addition to the adjustment of the water content by the water removing unit 30 before the exposure processing. Further, the substrate processing system 1 (substrate processing apparatus) may adjust the reaction water amount (water content) by adjusting the residence time of each wafer W within the exposure apparatus 3.

The substrate which is the processing target is not limited to the semiconductor wafer, and may be, e.g., a glass substrate, a mask substrate, an FPD (Flat Panel Display), or the like.

According to the exemplary embodiments, the substrate processing apparatus, a substrate processing method and a recording medium that are effective in improving the dimensional stability of the resist pattern formed by using the metal-containing resist are provided.

From the foregoing, it will be appreciated that various exemplary embodiments of the present disclosure have been described herein for the purposes of illustration, and that various modifications may be made without departing from the scope and spirit of the present disclosure. Accordingly, the various exemplary embodiments disclosed herein are not intended to be limiting, with the true scope and spirit being indicated by the following claims.

We claim:

1. A substrate processing apparatus, comprising:
    a film forming processing unit configured to form a metal-containing resist film on a substrate;
    a heat treatment unit configured to perform a heating processing on the substrate on which the film is formed and in which an exposure processing is performed on the film;
    a developing processing unit configured to perform a developing processing on the film formed on the substrate on which the heating processing is performed; and
    an adjustment controller configured to reduce a difference between substrates in an amount of water that reacts in the film formed on the substrate during the heating processing,
    wherein the adjustment controller adjusts a water content contained in the film of each substrate at least before the exposure processing to reduce a difference between the substrates in the water content when the heating processing is started,
    wherein the substrate processing apparatus further comprises:
    a transfer device configured to transfer the substrate; and
    a substrate accommodating unit configured to suppress a variation in the water content as compared with a transfer space where the transfer device is accommodated,
    wherein the adjustment controller controls the transfer device to carry the substrate, on which the film is formed by the film forming processing unit but the exposure processing is not performed, into the substrate accommodating unit.

2. The substrate processing apparatus of claim 1,
    wherein the adjustment controller controls the transfer device to reduce a difference between the substrates in a time period from when the substrate is carried out of the film forming processing unit to when the substrate is carried into the substrate accommodating unit.

3. The substrate processing apparatus of claim 1, further comprising:
    a transfer device configured to transfer the substrate; and
    a water removing unit configured to decrease the water content,
    wherein the adjustment controller controls the transfer device to carry the substrate, on which the film is formed by the film forming processing unit but the exposure processing is not performed, into the water removing unit.

4. The substrate processing apparatus of claim 3,
    wherein the adjustment controller controls the transfer device to carry the substrate out of the water removing unit at a timing set to reduce the difference between the substrates in the water content when the substrate is carried out of the water removing unit as compared with when the substrate is carried into the water removing unit.

5. The substrate processing apparatus of claim 1,
    wherein the adjustment controller adjusts the water content of each substrate at least after the exposure processing to reduce the difference between the substrates in the water content when the heating processing is started.

6. The substrate processing apparatus of claim 5,
wherein the adjustment controller adjusts the water content of each substrate after the exposure processing based on a residence time within an apparatus for the exposure processing.

7. The substrate processing apparatus of claim 6, further comprising:
a transfer device configured to transfer the substrate; and
a water removing unit configured to decrease the water content,
wherein the adjustment controller controls the transfer device to carry at least some of the substrates into the water removing unit after the exposure processing and carry the at least some of the substrates out of the water removing unit at a timing set to increase a residence time of the substrates within the water removing unit as the residence time within the apparatus for the exposure processing decreases.

8. The substrate processing apparatus of claim 6, further comprising:
a transfer device configured to transfer the substrate; and
a humidifying unit configured to increase the water content,
wherein the adjustment controller controls the transfer device to carry at least some of the substrates into the humidifying unit after the exposure processing and carry the at least some of the substrates out of the humidifying unit at a timing set to increase a residence time of the substrates within the humidifying unit as the residence time within the apparatus for the exposure processing increases.

9. The substrate processing apparatus of claim 1,
wherein the adjustment controller controls the heat treatment unit to increase a heating time of the substrate as a residence time within an apparatus for the exposure processing increases.

10. A substrate processing method, comprising:
forming a metal-containing resist film on a substrate;
performing a heating processing on the substrate on which the film is formed and in which an exposure processing is performed on the film;
performing a developing processing on the film formed on the substrate to which the heating processing is performed; and
reducing a difference between substrates in an amount of water that reacts in the film formed on the substrate during the heating processing,
wherein the reducing of the difference between substrates in an amount of water includes:
adjusting a water content contained in the film of each substrate at least before the exposure processing to reduce a difference between the substrates in the water content when the heating processing is started; and
carrying the substrate, on which the film is formed but the exposure processing is not performed, into a substrate accommodating unit by a transfer device,
wherein the substrate accommodating unit is configured to suppress a variation in the water content as compared with a transfer space where the transfer device is accommodated.

11. A non-transitory computer-readable recording medium having stored thereon computer-executable instructions that, in response to execution, cause an apparatus to perform a substrate processing method as claimed in claim 10.

12. A substrate processing apparatus, comprising:
a film forming processing unit configured to form a metal-containing resist film on a substrate;
a heat treatment unit configured to perform a heating processing on the substrate on which the film is formed and in which an exposure processing is performed on the film;
a developing processing unit configured to perform a developing processing on the film formed on the substrate on which the heating processing is performed; and
an adjustment controller configured to reduce a difference between substrates in an amount of water that reacts in the film formed on the substrate during the heating processing,
wherein the adjustment controller adjusts a water content contained in the film of each substrate at least before the exposure processing to reduce a difference between the substrates in the water content when the heating processing is started,
wherein the substrate processing apparatus further comprises:
a transfer device configured to transfer the substrate; and
a water removing unit configured to decrease the water content,
wherein the adjustment controller controls the transfer device to carry the substrate, on which the film is formed by the film forming processing unit but the exposure processing is not performed, into the water removing unit.

13. The substrate processing apparatus of claim 12,
wherein the adjustment controller controls the transfer device to carry the substrate out of the water removing unit at a timing set to reduce the difference between the substrates in the water content when the substrate is carried out of the water removing unit as compared with when the substrate is carried into the water removing unit.

14. A substrate processing apparatus, comprising:
a film forming processing unit configured to form a metal-containing resist film on a substrate;
a heat treatment unit configured to perform a heating processing on the substrate on which the film is formed and in which an exposure processing is performed on the film;
a developing processing unit configured to perform a developing processing on the film formed on the substrate on which the heating processing is performed; and
an adjustment controller configured to reduce a difference between substrates in an amount of water that reacts in the film formed on the substrate during the heating processing,
wherein the adjustment controller adjusts a water content contained in the film of each substrate at least after the exposure processing to reduce a difference between the substrates in the water content when the heating processing is started,
wherein the adjustment controller adjusts the water content of each substrate after the exposure processing based on a residence time within an apparatus for the exposure processing.

15. The substrate processing apparatus of claim 14, further comprising:
a transfer device configured to transfer the substrate; and
a water removing unit configured to decrease the water content, wherein the adjustment controller controls the transfer device to carry at least some of the substrates into the water removing unit after the exposure processing and carry the at least some of the substrates out of the water removing unit at a timing set to increase a residence time of the substrates within the water removing unit as the residence time within the apparatus for the exposure processing decreases.

16. The substrate processing apparatus of claim 14, further comprising:
a transfer device configured to transfer the substrate; and
a humidifying unit configured to increase the water content,
wherein the adjustment controller controls the transfer device to carry at least some of the substrates into the humidifying unit after the exposure processing and carry the at least some of the substrates out of the humidifying unit at a timing set to increase a residence time of the substrates within the humidifying unit as the residence time within the apparatus for the exposure processing increases.

17. A substrate processing apparatus, comprising:
a film forming processing unit configured to form a metal-containing resist film on a substrate;
a heat treatment unit configured to perform a heating processing on the substrate on which the film is formed and in which an exposure processing is performed on the film;
a developing processing unit configured to perform a developing processing on the film formed on the substrate on which the heating processing is performed; and
an adjustment controller configured to reduce a difference between substrates in an amount of water that reacts in the film formed on the substrate during the heating processing,
wherein the adjustment controller controls the heat treatment unit to increase a heating time of the substrate as a residence time within an apparatus for the exposure processing increases.

* * * * *